United States Patent [19]

Shibasaki et al.

[11] 4,227,039
[45] Oct. 7, 1980

[54] THIN-FILM MICROCIRCUIT BOARD

[75] Inventors: Ichiro Shibasaki; Kaoru Ohmura; Takeo Kimura; Hidehiko Kobayashi, all of Fuji, Japan

[73] Assignee: Asahi Kasei Kogyo Kabushiki Kaisha, Osaka, Japan

[21] Appl. No.: 953,497

[22] Filed: Oct. 23, 1978

[30] Foreign Application Priority Data

Oct. 24, 1977 [JP] Japan .................................. 52-126730
Nov. 7, 1977 [JP] Japan .................................. 52-132524

[51] Int. Cl.$^2$ ............................................. H05K 01/14
[52] U.S. Cl. ..................................... 174/68.5; 338/307;
338/308; 428/201; 430/311; 156/630; 156/634; 156/643
[58] Field of Search ............... 174/68.5; 338/307, 308; 428/201; 427/43

[56] References Cited

U.S. PATENT DOCUMENTS

| 3,379,568 | 4/1968 | Holmes | 174/68.5 X |
| 3,772,631 | 11/1973 | Owen | 338/308 X |
| 3,801,366 | 4/1974 | Lemelson | 174/68.5 X |
| 3,947,801 | 1/1975 | Bube | 338/308 |
| 3,977,840 | 8/1976 | Estep | 29/195 |
| 4,000,334 | 12/1976 | Hallman | 427/43.1 X |
| 4,082,861 | 4/1978 | Izu | 427/43.1 |
| 4,121,007 | 10/1978 | Kobayashi et al. | 428/201 |

FOREIGN PATENT DOCUMENTS 1106893 3/1960 Fed. Rep. of Germany .
1425373 2/1976 United Kingdom .................... 174/68.5

OTHER PUBLICATIONS

Miller, L. F., Preventing Corroison of Deleted Printed Circuit Lines, IBM Tech. Disclosure Bull, vol. 17, #2, Jul. 1974, p. 439.
Kremen, S. H., Laser Hole Making in Printed Circuit Boards, IBM Tech. Disclosure Bull., vol. 8, #3, Aug. 1965, p. 434.
Carlson et al., Helium–Neon Laser: Thermal High-–Resolution Recording; *Science,* vol. 154, pp. 1550–1551, Sep. 1966.
Amodei et al., Holograms in Thin Bismuth Films; *Applied Physics Letters,* Jun. 1969, vol. 15, #2, pp. 45–46.

*Primary Examiner*—Richard R. Kucia
*Attorney, Agent, or Firm*—Armstrong, Nikaido, Marmelstein & Kubovcik

[57] ABSTRACT

Deposited on a glass or ceramic substrate for a thin-film microcircuit board such as a hybrid IC board or a transparent electrode is a thin-film laminate, which comprises a dispersion metal thin-film dispersible and evaporable upon application of an energy above a threshold value and an electrical property-imparting film defining a conductor or a resistor. Then a high intensity of light having an energy sufficient to cause dispersion is applied selectively on the thin-film laminate, thereby removing exposed portions of the thin-film laminate as a result of dispersion and evaporation thereof. Unexposed portions of the thin-film laminate provide a desired pattern. The electrical property-imparting film is a thin-film of noble metal such as gold, silver or platinum or a thin film of transparent electrode material such as $SnO_2$ or $In_2O_3$, which is not easily dispersible upon application of the above energy.

9 Claims, 14 Drawing Figures

THIN-FILM MICROCIRCUIT BOARD

The present invention relates to the production techniques of thin-film microcircuit boards for electronic devices, and more particularly to the structure and manufacturing method of thin-film microcircuit boards and transparent conductive thin-film circuit boards which can be manufactured easily with a relatively high accuracy and high packaging density.

Conventionally used thin-film microcircuit boards comprising a dielectric substrate, such as ceramic, glass or resin laminate having a circuit pattern of thin-film conductors and resistors are usually fabricated by two methods, such as used in the manufacture of hybrid integrated circuits (ICs), that is, a masked evaporation method employing a relatively large pattern forming metallic mask and photoetching method, such as disclosed in the U.S. Pat. No. 3,977,840 to Estep et al., issued on Aug. 31, 1976. It is known to manufacture conventional transparent conductive thin-film microcircuit boards by an RF ion bombardment etching method employing a photo-resist mask as disclosed in the U.S. Pat. No. 3,957,609 to Sasano et al., issued on May 18, 1976.

However, the masked evaporation methods require difficult operations of aligning the substrate and the mask and positioning them for bonding. The evaporation mask is usually called a hard mask consisting of a stainless steel sheet formed with an evaporation pattern by perforation, and the mask must be of a considerable thickness to meet the required mask strength. Consequently, it is difficult to produce an evaporated pattern with a high resolution, thus setting a limit to the increase in packaging density.

On the other hand, the photocetching method and the RF ion bombardment etching method have the disadvantages of complicated manufacturing steps due to the necessity to use a large number of steps, such as, the application of resist, drying, pattern exposure, development, drying, etching, removal of resist and drying, thus increasing equipment costs and production costs. Particularly, where the photoetching method is used to produce a patterned deposit of noble metal which is frequently used as conductor wiring or electrodes, aqua regia (nitrohydrochloric acid) or the like must be used as the etching solution, thus not only requiring a complicated treatment of the etching solution but also giving rise to a problem of waste liquid disposition.

A prior art method of producing a thin-film microcircuit board is disclosed in the U.S. Pat. No. 3,920,485 to Amsell et al., issued on Nov. 18, 1975. Transparent conductive microcircuit boards of the type having patterned conductors and used in applications such as liquid crystal displays and image pick-up tubes are disclosed, for example, in the previously mentioned U.S. Pat. No. 3,957,609, the Fergason U.S. Pat. No. 3,918,796 issued on Nov. 11, 1975 and the Byatt U.S. Pat. No. 3,914,019 issued on Oct. 21, 1975.

With the recent progress in the high density fabrication of microcircuit boards for electronic components, there has existed a need for an inexpensive thin-film microcircuit board having a high density circuit pattern with a resolution in the order of 20 lines/mm and ease of manufacture.

To meet this need, the present inventors have diligently engaged in research and found that a dry-process patterning method by so-called "thin-film dispersion by threshold energy radiation type" using no evaporation mask and proposed by the applicants in a copending application U.S. Ser. No. 906,254 filed on May 15, 1978 on the basis of Japanese Patent Applications Nos. 52-55465, 52-55959, 52-72122 and 52-72840 can be used advantageously to meet the need.

It has been found by this research that in the case of thin-film microcircuit boards fabricated by deposition on a substrate formed of an inorganic material such as glass or ceramic, only a single film structure consisting of an electric property-imparting layer such as a transparent conductive thin film or thin film of noble metal such as gold silver or palladium, the dispersion sensitivity of the deposited single film to the applied patterning radiation energy was not satisfactory and hence the patterning by the dispersion of the thin film was difficult.

However, the present inventors have discovered that a laminate structure in which a transparent conductive thin film or thin noble metal film is combined with a thin film of dispersible metal can be easily patterned by the above-mentioned thin film dispersion method. When exposed to a radiation greater in amount than a certain threshold the dispersible metal thin film is dispersed and removed to produce a pattern including removed portions and unexposed portions of the thin film. Thus, by selectively applying such an amount of energy in a desired pattern to the surface of the laminate e.g., by instantaneously applying a high intensity of radiation to the laminate structure, a combined layer of the dispersible metal film and the thin conductive film or thin noble metal film can be easily dispersed and removed along the pattern of applied energy, thus accomplishing desired patterning. In the laminate structure, the deposited thin dispersible metal film can be easily oxidized to make it transparent and the dispersible metal film can also be easily removed by etching, thus making it possible to produce a transparent thin-film microcircuit board as well as a highly stable thin-film microcircuit board in which the resistance values of the built-in resistors do not change with time.

It is therefore an object of the present invention to provide a thin-film microcircuit board having a high-density circuit pattern formed by a dry-process patterning and a method of manufacturing the same.

It is another object of the present invention to provide a microcircuit board having a transparent conductive thin film which can be produced with simple manufacturing steps to attain a high circuit density.

It is still another object of the present invention to provide a thin-film microcircuit board having a noble metal pattern which can be produced by simple manufacturing steps to effect a high-density processing.

It is still another object of the present invention to provide an inexpensive microcircuit board having a thin-film circuit pattern including high-density and high-stability thin-film conductors and resistors.

In accordance with the basic concept of the present invention there is provided a thin-film microcircuit board technology comprising depositing, on a dielectric substrate or polymer-coated substrate, superposed or laminated thin films comprising a thin film of dispersible metal which can be dispersed and removed when subjected to an amount of energy radiation greater than a threshold value and an electrical property-imparting thin film for forming thin-film conductors and/or thin-film resistors, and selectively applying to the surface of the laminate a radiation energy sufficient to produce a desired circuit pattern of the laminated thin films.

In accordance with the present invention, there is also provided a thin-film microcircuit board having a patterned transparent conductive thin film produced by oxidizing the thin dispersible metal film after the pattern formation or by etching to remove it. This transparent board is well suited for use as a display electrode for liquid crystal (LC) devices.

In accordance with the present invention, there is also provided a patterned thin-film microcircuit board produced by etching and removing the uppermost thin dispersible metal film after the pattern formation. The ceramic thin-film board provided according to the present invention is well suited for use as a hybrid IC board having various electronic components mounted thereon.

The above and other objects, features and advantages of the present invention will become readily apparent from the following description of the invention when taken in conjunction with the accompanying drawings in which:

Before describing the preferred embodiments of the present invention, a general construction of an integrated circuit board according to the present invention will be described with reference to FIGS. 1 and 2.

Figure 1:
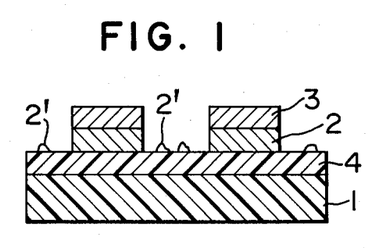
FIG. 1 is a sectional view of an integrated circuit board using the present invention.

FIG. 1 illustrates an exemplary construction of a hybrid integrated circuit board embodying the present invention. In the Figure, a polymer layer 4 is applied to the entire surface of one side of a dielectric substrate 1 formed of ceramic or resin material. Deposited and patterned on the polymer layer 4 is a laminate consisting of a thin dispersion metal film 2 which is dispersible by application of energy greater in amount than a threshold value and a thin noble metal film 3. Remaining on the exposed polymer layer 4 between the patterned laminates are fine particles or fragments 2' which are fine particles of the metal 2 dispersed during the patterning of the laminate, and the effect of the fine particles 2' on the circuit pattern is negligible as mentioned in the previously mentioned U.S. Ser. No. 906,254. The thin noble metal film 3 constitutes an electrical property-imparting film which provides thin-film conductors and/or thin-film resistors.

Figure 2:
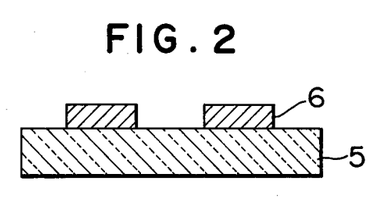
FIG. 2 is a sectional view of a transparent conductive thin film using the present invention.

FIG. 2 illustrates an exemplary construction of a transparent electrode using the present invention, in which a patterned transparent conductive film 6 is formed on a dielectric substrate 5 made of glass or the like. Deposited on the substrate 5 is a thin-film laminate consisting of a thin film of dispersible metal which can be dispersed and evaporated when subjected to energy greater than a threshold value and a thin film of electrical property-imparting material, such as conductive material, thereafter patterning the laminate by selectively applying the required radiation energy. The level of energy is obviously set at a value such as to effect dispersion of one of the materials of the laminate but not the other. After the pattern formation the dispersion metal film in the laminate is oxidized to make the same transparent, or the dispersed film is removed by etching.

The electrical property-imparting film used in the present invention to provide thin-film conductors and resistors may be a transparent conductive film or noble metal film. The transparent conductive film may be a deposited thin film of metal, such as gold, platinum or palladium or metal oxide such as indium oxide or tin oxide. The noble metal film may be a deposited thin film of metal, such as Ag, Au, Pt, Ru, Rh, Pd, Os or Ir. The electrical property-imparting layer may be deposited on the dielectric substrate by a known type of deposition system employing a thin-film deposition method, such as vacuum deposition, sputtering, ion plating or chemical vapor deposition. The thickness of the deposited film is in the range of 10 to 10,000 Å, and preferably 50 to 5,000 Å.

Figure 3A:
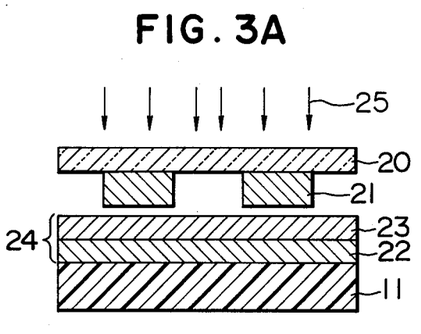
FIGS. 3A and 3B, respectively, are sectional views for explaining the manufacturing steps of a microcircuit board according to an embodiment of the present invention.
Figure 3B:
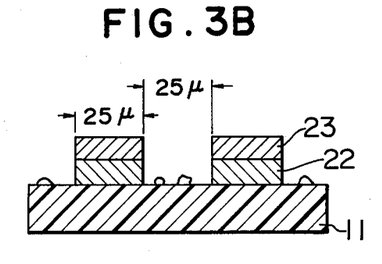

The dispersion metal film having a radiation-responsive dispersing-property and forming the thin-film laminate along with the electrical property-imparting layer, may be thin film of any metal such as Bi, Te, Ni, Cu, Sn, In, Pb, Zn, Se, Ge, Co, Fe, Ti, Sb, Al, Cd and alloys thereof disclosed in the specification of the applicant's U.S. Ser. No. 906,254, which can be dispersed and evaporated to form a desired pattern in response to the application of an energy greater than the threshold. The laminate consisting of these dispersion metal film and electrical property-imparting film may be formed by directly depositing the dispersion metal film on the substrate (FIG. 2) or the substrate coated with the polymer layer (FIG. 1) by the previously mentioned method and depositing on the dispersion metal film the electrical property-imparting film by the previously mentioned method. Alternatively the laminate may be formed by depositing the electrical property-imparting film on the substrate or the polymer-coated substrate and then depositing on it the dispersion metal film. While, in the fabrication of the laminate, either one of the films may be formed as the lower layer, forming the dispersion metal film as the lower layer facilitates the patterning by the energy (radiation) responsive dispersion. Where the dispersion metal film is oxidized to make it transparent as shown in FIG. 3, the metal film is formed by depositing a thin film of Bi, In, Pb, Zn, Ge, Ti, Sb or Al or any of their alloys. While, due to the fact that these dispersion metal films increase in resistance value when subjected to oxidation, an electrical property-imparting film having a low resistance must be deposited as the upper layer in cases where the electrical connections are made on the surface of the laminate, the dispersion metal film may be deposited as the upper layer depending on the electrical connection method used.

When the dispersion metal film of the laminate is removed by etching, this film must be deposited as the upper layer.

The dielectric substrate may for example be made of ceramic, glass, mica, polyester, polyimide, polyamide, cellulose acetate, polystyrene, polyethylene or laminate such as phenoric resin or epoxy resin laminate using a paper or glass cloth base, and in particular the ceramic substrate and glass substrate are respectively preferred for use as hybrid IC boards and transparent electrode plates.

In accordance with the present invention, a polymer layer may be provided as a primary coat between the substrate and the thin-film laminate to ensure an improved adhesion between the substrate and the laminate. The polymer layer used for this purpose should preferably be one having thermal decomposition resisting properties, and more preferably the polymer layer should also have good adhesion to the substrate and the laminate used. While the polymer may be either thermoplastic polymer or thermosetting polymer, preferably thermosetting polymer should be used.

Polymer layer materials that can be suitably used in this invention include epoxy resin, polyurethane, polycarbonate, polyamide, polyamidimide, polyimide and polyester, and a suitable initiator or hardener may be advantageously added to the thermosetting polymer layer materials. The polymer layer material may be dissolved in a suitable solvent and applied to any desired thickness. The layer thickness should preferably be in the range between 1 and 100μ.

The method of patterning the laminate of the invention comprising the dispersion metal film and the transparent conductive film or the noble metal film may be one in which the laminate is exposed to light through a light-exposure mask (See the previously mentioned U.S. Ser. No. 906,254), another in which the laminate is scanned with an energy modulated in a desired pattern (See "Science" Vol. 154, 1966, pp. 1550–1551 and "Applied Physics Letters" Vol. 15, No. 2, 1969, pp. 45–46) and the like. In this way, the required energy which is sufficient to disperse and evaporate the exposed portions of the dispersion metal film and the transparent conductive film or the noble metal film is applied. When the light exposure masking method is used, it is only necessary to place the mask in close contact with the substrate and there is no need to apply any resist mask onto the laminate. While, in actual practice, the mask is directly placed on the substrate, due to the thickness of the chromium pattern, etc., there actually exists a gap in the order of several microns between the mask and the substrate, thus allowing the dispersion and evaporation of the thin film metals by exposure. Preferred types of energy include radiation energy and particle energy which should more preferably be of pulse type. For example, a flash lamp, infrared lamp, laser or electron beam may be used.

In oxidizing the dispersion metal film in accordance with the invention, various methods may be used including a method of heating the metal film in an oxygen atmosphere, a method of using oxidizing agent such as hydrogen peroxide, a method using light exposure, charging or discharging in the presence of oxygen, an anodic oxidation method, etc. Any of these methods may be suitably selected depending on the type of the dispersion metal film used. In oxidizing the metal film, the oxidation will be facilitated in the presence of water. It is undesirable to heat the dispersion metal film above its melting point since this causes sinking of the electrical property-imparting film. Where the dispersion metal film is removed by etching, it is possible to effect the etching by using any of the known etching agents that suits the type of the dispersion metal film used. Instead of these chemical etching methods, dry-etching methods such as plasma etching or ion beam etching may be used.

Also, to ensure an improved adhesion between the substrate and the laminate and hence improved reliability, if necessary, a heat treatment, formation of a protective coating such as $SiO_2$ or high molecular polymer coating or the like is effected after the oxidation treatment or the etching treatment. In particular, even if no oxide is formed on the dispersion metal film by this heat treatment, the metal film is no longer susceptible to external radiations.

The thin-film microcircuit board according to the invention allows the use of low temperature solders, conductive resin pastes or the like for making the desired connections, and the board includes the structures which allow, in dry-process, easy processing including the formation of wiring patterns of noble metals which have heretofore been used infrequently due to difficulty in patterning. By virtue of the dry-process manufacturing method, a highly reliable thin-film microcircuit pattern can be produced without contamination and usually there is no need to form a protective layer on the noble metal conductive pattern. In addition, the structure in which the dispersion metal film is deposited and oxidized to underlie the noble metal film has the effect of improving the adhesion between the substrate and the electrical property-imparting film of noble metal or the like. On the contrary, the structure in which the dispersion-metal film is deposited as the upper layer and subjected to oxidation, is advantageous in that the oxide upper layer serves as a protective layer for the conductor or resistor pattern. This structure will be described in detail with reference to FIG. 5.

The following examples describe in greater detail the manufacture of the thin-film microcircuit board in accordance with the present invention. The invention is not intended to be limited to the particular examples since many changes and modifications of the invention are possible in the light of the teachings of the invention.

EXAMPLE 1

Referring to FIGS. 3A and 3B, a method for the manufacture of a hybrid IC board according to an embodiment of the invention will now be described.

Bismuth was vapor deposited on the entire upper surface of a glass substrate 11 to form a 1000 Å-thick-bismuth thin film 22 for a dispersion-metal film. Gold was then vapor deposited to a thickness of 110 Å on the entire surface of the thin film 22, thus preparing the substrate 11 having a multi-layer or laminate 24 of the bismuth film and a noble metal thin film 23 deposited thereon. A light-exposure mask 20 having a desired chromium pattern 21 is placed in close contact with the thin-film laminated substrate 11 and then the laminated substrate is placed in a light exposure apparatus (FIG. 3A). The light exposure apparatus comprises a light source 25 of a one-shot type xenon discharge lamp (not shown) having a pulse width of 100 μsec, a condensor capacitance of 120 μF and a voltage of 1200 V. A high intensity of light was instantaneously applied to the multi-layer 24 from the light source 25 through the mask 20 with a lamp-to-mask distance of 1 cm under the surrounding conditions of normal pressure and temperature in the air. As a result, light-exposed portions of the laminate 24 were dispersed and evaporated. In this way, a pattern of the bismuth-gold multi-layer 24 was formed (FIG. 3B). The width of the patterned multi-layer 24 was 25μ and the pattern spacing was 25μ. In other words, the conductive pattern of the gold deposit film had a resolution of 20 lines/mm and a surface resistance of 30 Ω/□. In contrast to the above, a substrate having a 110 Å-thick gold single layer was subjected to the exposure patterning operation in the same manner as described above; however, no pattern would result.

EXAMPLE 2

Tellurium was vapor deposited on a glass substrate to a thickness of 200 Å, and then silver was vapor deposited on the tellurium film to a thickness of 200 Å, thereby forming a Te-Ag thin-film laminate. Thereafter, the laminate was subjected to exposure patterning in the same manner as in Example 1, thus forming a pattern of the tellurium silver laminate with a resolution of 20 lines/mm and a surface resistance of 20 Ω/□.

EXAMPLE 3

Basically, this example was a modification of Example 1 and a primary coat was deposited as shown by numeral 4 in FIG. 1 so as to improve the adhesion between the substrate and the deposited metal film.

Epoxy resin adhesive "XA-564-4" manufactured by Bostik Japan Co. was applied on the entire surface of one side of a ceramic substrate to form a 5μ-thick resin coating when dried. After the epoxy resin adhesive had been heated at 180° C. for 20 minutes, titanium was vapor deposited on the resin coating to form a 200 Å-thick Ti metal layer and then palladium was vapor deposited to a thickness of 200 Å on the titanium layer, thus forming a Ti-Pd laminate on the substrate. In a similar manner as the exposure patterning process of Example 1, the light-exposure mask was placed on the Ti-Pd laminate and it was then exposed to light, thereby causing it to disperse and producing a desired pattern of the Ti-Pd laminate. The resolution of the thus formed pattern was 20 lines/mm and the surface resistance was 200 Ω/□. Where titanium was used for the dispersion metal, the vapor deposit thickness was reduced as compared with the bismuth film of Example 1 since titanium was lower in dispersion sensitivity than bismuth.

EXAMPLE 4

Figure 4A:
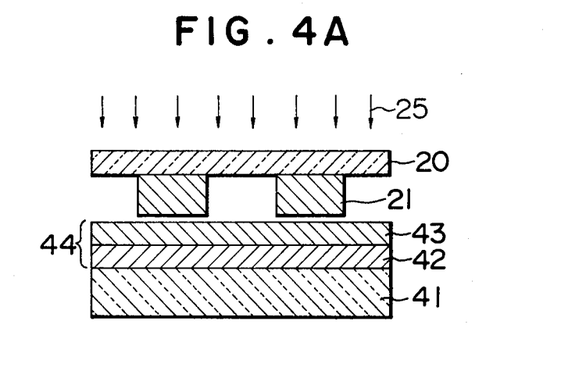
FIGS. 4A to 4C, respectively, illustrate in longitudinal section the steps of process for fabricating the transparent conductive thin film according to another embodiment of the present invention.
Figure 4B:
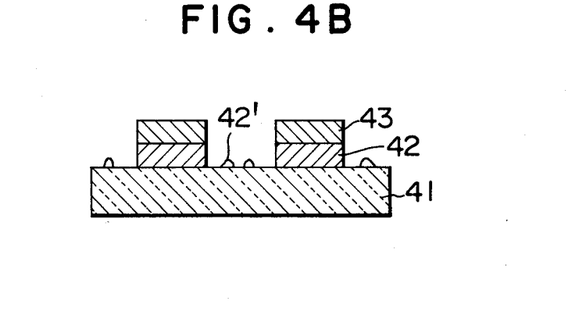
Figure 4C:
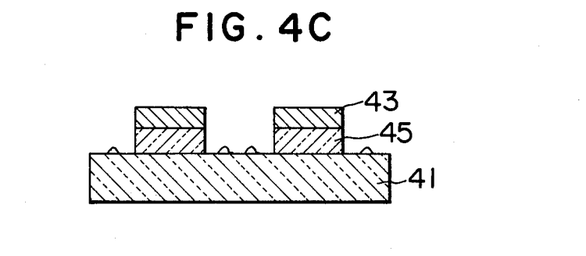

As shown in FIGS. 4A to 4C, Rose's alloy (containing 27% by weight of Sn, 24% by weight of Pb and 49% by weight of Bi) was deposited by sputtering to a thickness of 500 Å on one surface of a glass substrate 41, thereby forming a dispersion metal film 42. Then gold was vapor deposited to a thickness of 100 Å on the metal film 42 to form a gold-alloy laminate 44. Through the chromium mask 20 placed in close contact with the laminate 44, the laminate 44 was subjected to light exposure, so that the exposure patterning was effected in the same manner as Example 1 (FIG. 4A). The exposed portions of the thin-film laminate 44 were removed by dispersion and evaporation and fine dispersed particles 42' remained partially. The unexposed portions were left as such thus forming a pattern of the Rose's alloy-gold thin-film laminate 44 (FIG. 4B). The substrate comprising the patterned composite film laminate 44 was placed in a constant temperature and humidity tank where the Rose's alloy film 42 was oxidized under the surrounding conditions having a temperature of 80° C. and a relative humidity of 90%, and the substrate was then placed in an oven and heat-treated at 250° C. for 60 minutes. In this way, a transparent thin-film microcircuit board was produced, in which the film 42 was converted to a transparent Rose's alloy oxide film 45. The patterned transparent microcircuit in the board has an optical density of 0.2, a surface resistance of 30 Ω/□ and a resolution of 20 lines/mm.

EXAMPLE 5

In this example as a modification of Example 1, a transparent conductive thin-film board was produced using tin oxide for the electrical property-imparting film and bismuth for the dispersion metal film. Bismuth was vapor deposited to a thickness of 1500 Å on a glass substrate, and subsequently tin oxide was sputtered to a thickness of 1000 Å on the bismuth film. The thin-film laminate on the substrate was patterned by the light exposure in a similar manner as in Example 1 and then heat treated at 300° C. for 60 minutes. In this way, the transparent conductive pattern on the board has an optical density of 0.1, a surface resistance of 200 Ω/□ and a resolution of 20 lines/mm.

EXAMPLE 6

Epoxy resin adhesive "XA-564-4" manufactured by Bostik Japan Co. was applied on a ceramic substrate to a thickness of 5μ when dried and then heated at 180° C. for 20 minutes. Thereafter, indium oxide was sputtered to a thickness of 500 Å on the resin coating and then nickel was was vapor deposited on the indium oxide film to a thickness of 1000 Å. Thereafter, by using the same exposure patterning method as in Example 1 except that a exposure voltage of 1500 V was used here, the indium oxide-nickel thin-films laminate on the substrate surface were patterned. Thereafter, the nickel thin film on the substrate was etched off by dissolving it in aqueous solution containing 2% of nitric acid, and then the substrate was heat-treated at 160° C. for 30 minutes to improve the adhesion of the remaining indium oxide film, thus completing the circuit board. The thin-film microcircuit pattern in the thus produced board had a surface resistance of 500 Ω/□ and a resolution of 20 lines/mm. This example was different from Example 3 in that the dispersion metal film constituting part of the laminate on the substrate was deposited as the upper layer, thus allowing its removal by etching after the patterning operation.

EXAMPLE 7

In this example, lead was vapor deposited to a thickness of 1000 Å on a glass substrate. Platinum was then sputtered to a thickness of 150 Å on the lead film, thus forming a Pb-Pt 150 thin-film laminate on the glass substrate. Thereafter, the chromium mask was placed in close contact with the Pb-Pt laminate and a laser beam was irradiated from an Nd.YALG laser having a pulse width of 50 μsec and a power of 50 m Joule, thus dispersing and evaporating the irradiated portions of the Pb-Pt thin-film laminate and thereby forming a pattern of the thin-film laminate on the substrate. The substrate was then placed in an air conditioning tank having a temperature of 80° C. and a relative humidity of 90%, thus oxidizing the lead thin film, and then the laminated board was heat treated at 200° C. for 60 minutes. As a result, a transparent conductive thin-film microcircuit pattern was formed on the substrate. The pattern had an optical density of 0.2, a surface resistance of 50 Ω/□ and a resolution of 20 lines/mm.

EXAMPLE 8

Referring now to FIGS. 5A to 5G, the method of the invention for manufacturing a hybrid IC board including a composite patterned thin-film microcircuit will be described.

Figure 5A:
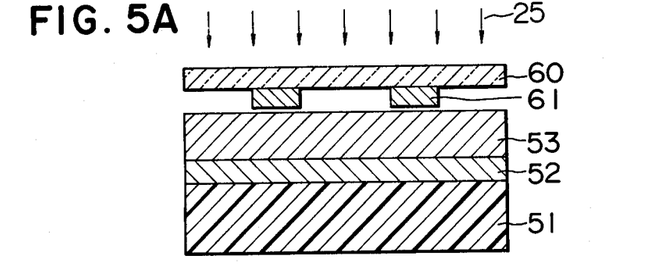
FIGS. 5A through 5G, respectively, illustrate in longitudinal section the steps of process for fabricating an integrated circuit board incorporating therein patterned thin-film conductors and resistors according to another embodiment of the present invention.
Figure 5B:
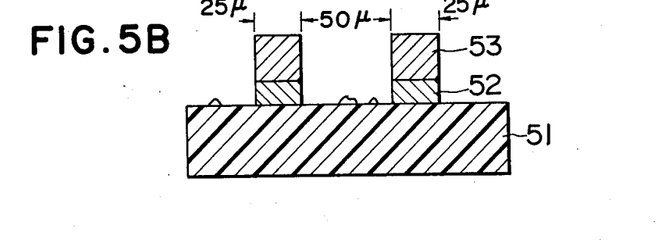
Figure 5C:
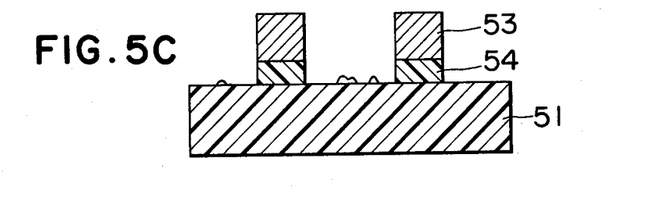
Figure 5D:
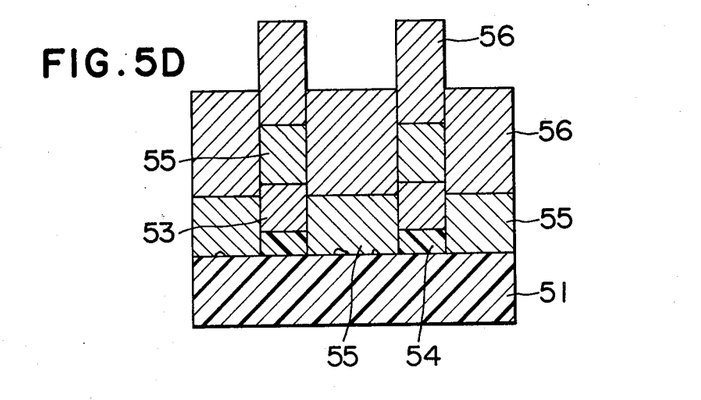
Figure 5E:
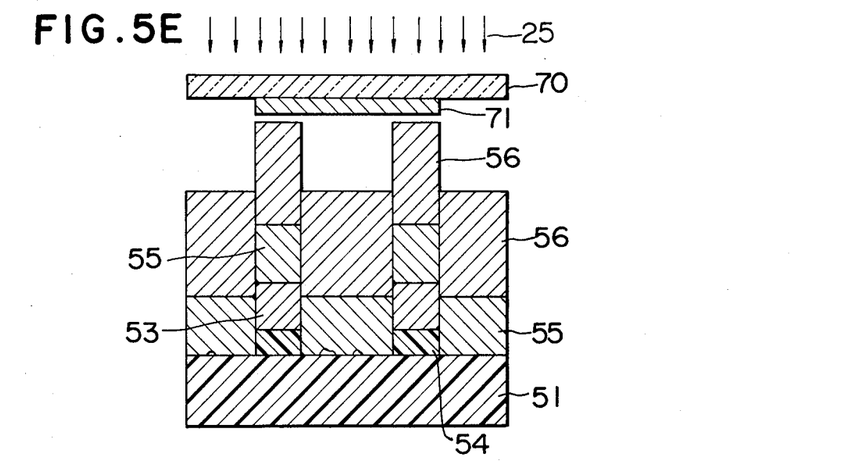
Figure 5F:
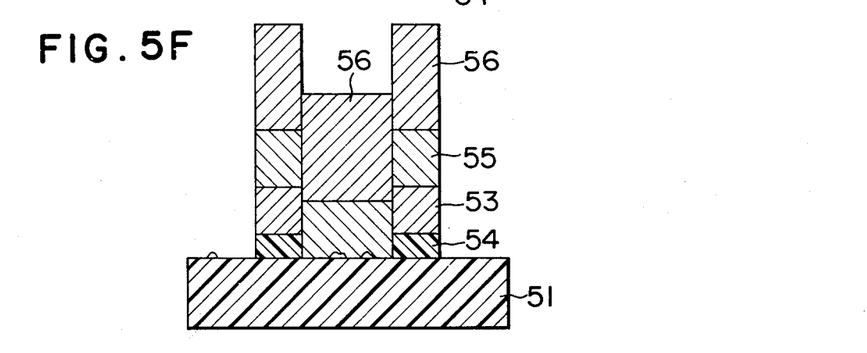
Figure 5G:
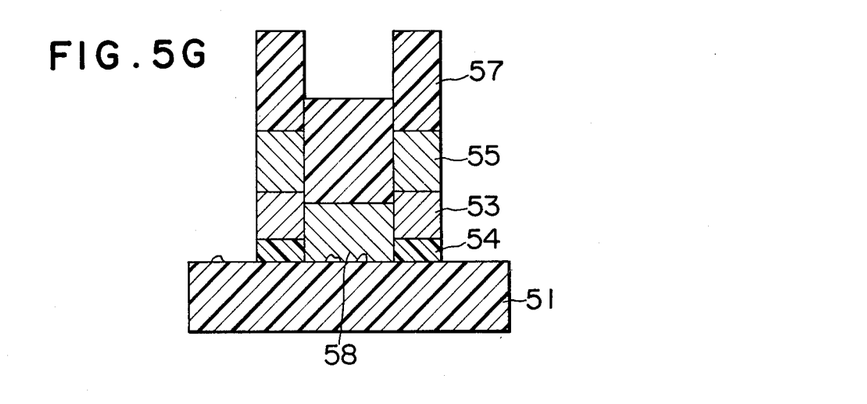

In this example, bismuth was vapor deposited to a thickness of 200 Å on a glass substrate 51 and silver was vapor deposited to a thickness of 400 Å on the bismuth film, thus forming a thin-film laminate consisting of a bismuth film 52 and a silver film 53. Then, a chromium mask 60 having a chromium pattern 61 corresponding to a desired electrode pattern was placed in close contact with the thin-film laminate. The thin-film laminate was then exposed to light from a one-shot type xenon discharge lamp 25 (FIG. 5A) having a pulse width of 100 $\mu$sec, a capacitor capacitance of 120 $\mu$F and a voltage of 1200 V with a lamp-to-mask spacing of 1 cm. The exposed portions of the thin-film laminate were removed by dispersion and evaporation. As a result, the unexposed portions of the thin film laminate were left on the substrate and an electrode pattern of silver was formed on the substrate. Scattered fine particles would in some cases remain in the removed thin film areas on the substrate (FIG. 5B). The substrate was then heat treated at 200° C. for 60 minutes to oxidize the deposited bismuth film 52 and thereby to form a bismuth oxide thin film 54 underlying the silver thin film 53. (FIG. 5C). Subsequently, the thin-film electrode pattern was formed on the substrate in this way, and then nickel-chromium was vapor deposited to a thickness of 500 Å on the entire surface of the substrate, and bismuth was then vapor deposited to a thickness of 1000 Å on the Ni-Cr film, thus forming the thin-film laminate comprising the Ni-Cr deposit 55 and the bismuth deposit 56 (FIG. 5D). Thereafter, a light exposure mask 70 having a chromium pattern 71 corresponding to a resistor pattern of a desired dimension was placed in close contact with the Ni-Cr-Bi laminate and the laminate was exposed to the light from the one-shot type xenon discharge lamp 25 as shown in Example 1 (FIG. 5E). As a result, exposed portions of the thin-film Ni—Cr—Bi laminate were removed by dispersion and evaporation. Unexposed portions corresponding to an electrode and resistor were left (FIG. 5F). Thereafter, the board was heat treated at 200° C. for 60 minutes, and the bismuth thin film 56 was oxidized into oxide film 57. In this way, a patterned resistor 58 of Ni-Cr film geometrically defined by the silver electrodes 53 was formed. The resistor 58 was 50$\mu$ wide and 2.5 mm long and its resistance value was 1 K$\Omega$.

We claim:

1. A thin film microcircuit board comprising:
   a dielectric substrate; and
   a thin-film laminate formed on said substrate, said thin-film laminate comprising a thin-film of a dispersion-metal dispersible and evaporable upon application of an energy above a threshold value and an electrical property-imparting thin film singly not easily dispersible, being dispersible in the form of said laminate by said energy application and capable of providing a conductor film, said dispersion-metal thin film having a thickness between 100 and 5000 Å and being formed of a member selected from the group consisting of Bi, Te, Ni, Cu, Sn, In, Pb, Zn, Se, Ge, Co, Fe, Ti, Sb, Al, Cd, and alloys thereof, said electrical property-imparting film having a thickness of between 50 and 5000 Å, and being formed of a member selected from the group consisting of Ag, Au, Pt, Ru, Rh, Pd, Os, Ir, Ir$_2$, O$_3$ and SnO$_2$;
   said thin-film laminate being patterned in a desired circuit form by the dispersion thereof by the application of an energy above a threshold value.

2. A thin-film microcircuit board comprising:
   a dielectric substrate;
   a thin-film laminate deposited on said dielectric substrate, said thin-film laminate comprising a lower layer consisting of a thin film of an oxide of a dispersion-metal dispersible and evaporable upon irradiation of a high-intensity light having an energy above a threshold value and an upper layer of an electrical property-imparting thin film formed of a transparent material constituting a conductive film, said dispersion-metal being at least one material selected from the group consisting of Bi, Ti, Sb, Al, Ge, Zn, Pb, In and alloys thereof and having a thickness between 50 and 5000 Å, and said electrical property-imparting film being formed of at least one material selected from the group consisting of Au, Pt, Pd, In$_2$O$_3$ and SnO$_2$;
   said thin-film laminate having dispersed portions and undispersed portions formed by dispersion of said disperson metal; and
   a pattern circuit of the electrical property-imparting film on the undispersed portions of the laminate.

3. A thin-film microcircuit board comprising:
   a dielectric substrate; and
   a thin-film laminate deposited on said dielectric substrate, said thin-film laminate comprising an upper layer consisting of a thin film of a disperson metal dispersible and evaporable upon application of an energy above a threshold value, and a lower layer consisting of an electrical property-imparting film formed of a noble metal constituting a conductive film, said dispersion metal thin film having a thickness between 100 and 5000 Å and being formed of a member selected from the group consisting of Bi, Te, Ni, Cu, Sn, Ni, Pb, Zn, Se, Ge, Co, Fe, Ti, Sb, Al, Cd and alloys thereof, said electrical property-imparting film having a thickness between 50 and 5000 Å and being formed of a member selected from the group consisting of Ag, Au, Pt, Ru, Pd, Os, Ir, In$_2$O$_3$ and SnO$_2$;
   said thin film laminate being formed in a circuit pattern as a result of dispersion and evaporation thereof by application of an energy above a threshold value.

4. A thin-film microcircuit board as claimed in claim 1 wherein said energy is applied from a one-shot type xenon discharge lamp.

5. A thin-film microcircuit board as in claim 2 wherein said lamp has a pulse width of 100 $\mu$sec, a condensor capacitance of 120 $\mu$F and voltage of 1200 V.

6. A microcircuit board as set forth in claim 1, 2 or 3, wherein a polymer-coating layer is applied to said substrate under said laminate.

7. A microcircuit board as set forth in claim 1, 2 or 3, wherein said dielectric substrate is glass or ceramic.

8. A hybrid microcircuit board comprising:
   (a) a heat-stable dielectric substrate; and
   (b) a laminate deposited on said dielectric substrate, said laminate comprising a thin-film of a dispersion-metal dispersible and evaporable by the exposure of radiation of an energy above a threshold value and having a thickness between 100 and 5000 Å, and a noble metal thin film having a thickness between 50 and 5000 Å, said noble metal being selected from the group consisting of Ag, Au, Pt, Ru, Rh, Pd, Os and Ir, and being, upon said exposure to radiation, free of dispersion and being dispersible in the form of said laminate,
(c) said laminate being patterned by the exposure of radiation of an energy sufficient to cause dispersion of said dispersion-metal thin film to thereby remove exposed portions of the laminate, said noble metal thin film providing a conductive circuit film and a resistive film,
(d) said microcircuit board being heat treated to stabilize said conductive circuit film and resistive film.

9. A transparent electrode structure comprising:
(a) a glass substrate; and
(b) a laminate deposited on said glass substrate, said laminate comprising a thin film of an oxide of a dispersion-metal dispersible and evaporable upon a high intensity of radiation having an energy above a threshold value and having a thickness between 100 and 5000 Å, said dispersion metal including at least one selected from the group consisting of Bi, Ti, Sb, Al, Ge, Zn, Pb, In and alloys thereof and a transparent conductive thin film of a material selected from the group consisting of $In_2O_3$, $SnO_2$, Au, Pt and Pd and having a thickness between 50 and 5000 Å, and
(c) said laminate being patterned by application of said radiation energy sufficient to pattern said laminate.

* * * * *